(12) United States Patent
Dick et al.

(10) Patent No.: US 8,522,119 B2
(45) Date of Patent: Aug. 27, 2013

(54) REDUCTION IN DECODER LOOP ITERATIONS

(75) Inventors: Christopher H. Dick, San Jose, CA (US); Raghavendar M. Rao, Austin, TX (US)

(73) Assignee: XILINX, Inc., San Jose, CA (US)

( * ) Notice: Subject to any disclaimer, the term of this patent is extended or adjusted under 35 U.S.C. 154(b) by 111 days.

(21) Appl. No.: 13/313,631

(22) Filed: Dec. 7, 2011

(65) Prior Publication Data

US 2013/0151911 A1    Jun. 13, 2013

(51) Int. Cl.
*H03M 13/00* (2006.01)

(52) U.S. Cl.
USPC ........... 714/780; 714/752; 714/758; 714/786; 714/799; 714/792; 341/94; 375/265; 375/267; 375/340; 375/341

(58) Field of Classification Search
None
See application file for complete search history.

(56) References Cited

U.S. PATENT DOCUMENTS

| | | | |
|---|---|---|---|
| 6,557,139 B2 * | 4/2003 | Bohnke | 714/758 |
| 6,888,901 B2 * | 5/2005 | Yu et al. | 375/341 |
| 2003/0103584 A1 * | 6/2003 | Bjerke et al. | 375/340 |
| 2004/0205445 A1 * | 10/2004 | Xu | 714/792 |
| 2005/0111564 A1 * | 5/2005 | Kramer et al. | 375/265 |
| 2006/0195765 A1 | 8/2006 | Coffey | |
| 2006/0265634 A1 * | 11/2006 | Silvus et al. | 714/784 |
| 2007/0150797 A1 * | 6/2007 | Hwang et al. | 714/781 |
| 2007/0229329 A1 * | 10/2007 | Maru | 341/94 |
| 2007/0230609 A1 * | 10/2007 | Hwang et al. | 375/267 |
| 2008/0028277 A1 * | 1/2008 | Cho et al. | 714/758 |
| 2009/0296842 A1 | 12/2009 | Papadopoulos et al. | |
| 2010/0070819 A1 * | 3/2010 | Stein et al. | 714/752 |
| 2011/0113294 A1 * | 5/2011 | Chugg et al. | 714/704 |

OTHER PUBLICATIONS

U.S. Appl. No. 13/170,004, filed Jun. 27, 2011, Wu et al.
Valenti, Matthew, *Iterative Solutions Coded Modulation Library Theory of Operation*, Oct. 3, 2005, pp. 1-106, West Virginia University, Morgantown, West Virginia, USA.

* cited by examiner

*Primary Examiner* — John Trimmings
(74) *Attorney, Agent, or Firm* — W. Eric Webostad; LeRoy D. Maunu; Lois D. Cartier

(57) ABSTRACT

An embodiment of a method for decoding is disclosed. For this embodiment of the method, a decoder is limited to a set number of iterations for a decoding sequence. The set number of iterations is selected to be less than an optimal number of iterations for an optimal bit error rate ("BER") resulting in a BER penalty. Inner loop decoding operations are performed within the decoder for the set number of iterations. Reliability information is output from the decoder to a data slicer. A symbol stream is output from the data slicer responsive to the reliability information.

17 Claims, 4 Drawing Sheets

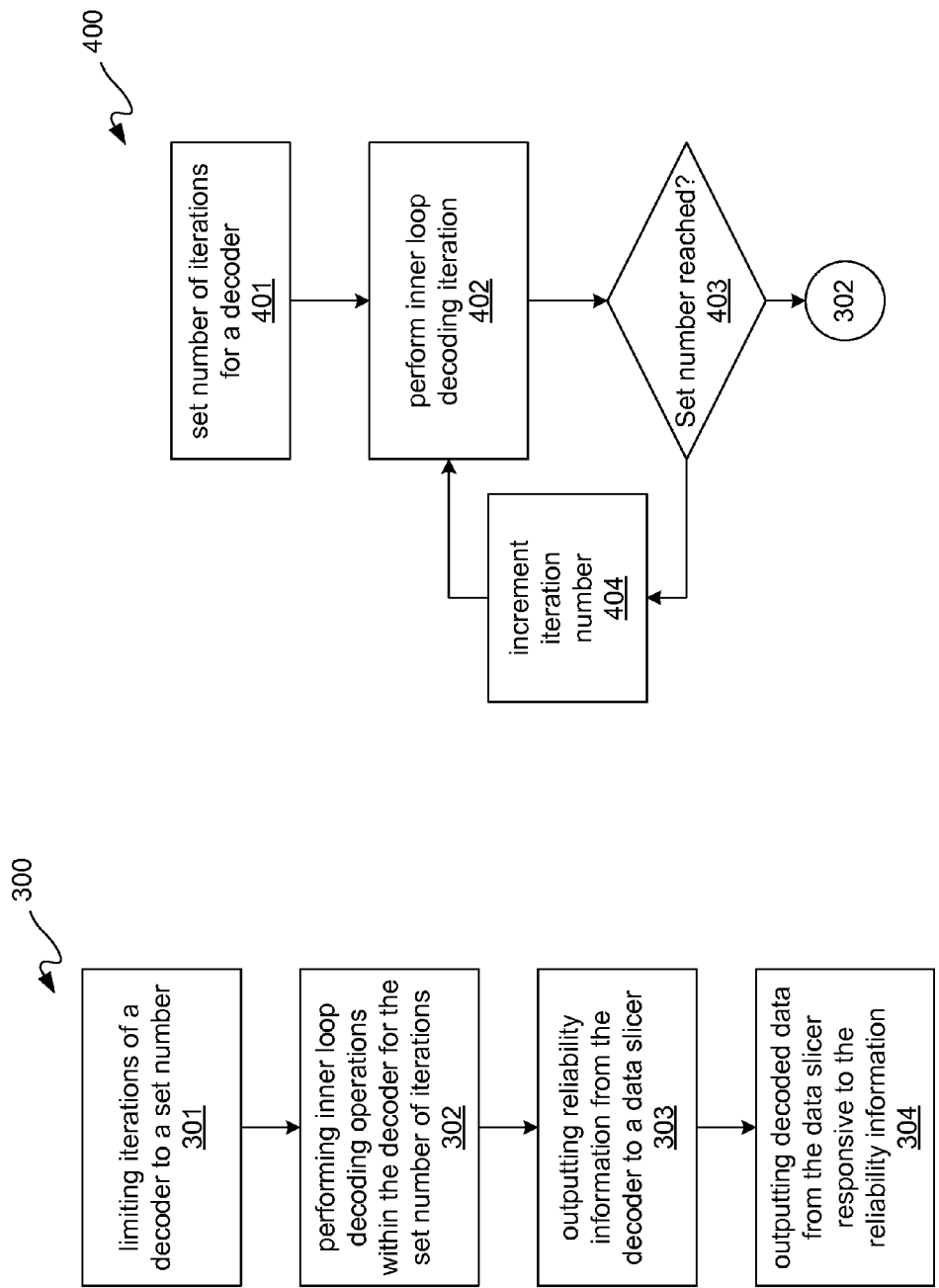

REDUCTION IN DECODER LOOP ITERATIONS

FIELD OF THE INVENTION

An embodiment of invention relates to integrated circuit devices ("ICs"). More particularly, an embodiment of the invention relates to a reduction in decoder loop iterations of an IC.

BACKGROUND

ICs are used for decoding. Turbo decoders are one type of decoder that is implemented in ICs. However, such IC implemented Turbo decoders may have a high-compute complexity. This high-compute complexity is a significant contributor to decoding latency of a Turbo equalizer. Hence, it is desirable and useful to provide a Turbo equalizer with a lower compute complexity to decrease decoding latency.

SUMMARY

One or more embodiments generally relate to a reduction in decoder loop iterations.

An embodiment relates generally to a method for decoding. In such an embodiment, a decoder is limited to a set number of iterations for a decoding sequence. The set number of iterations is selected to be less than an optimal number of iterations for an optimal bit error rate ("BER") resulting in a BER penalty. Inner loop decoding operations are performed within the decoder for the set number of iterations. Reliability information is output from the decoder to a data slicer. A symbol stream is output from the data slicer responsive to the reliability information.

Another embodiment relates generally to a decoder. In such an embodiment, a first estimation unit and a second estimation unit are coupled in a loop for iterative decoding. A scheduler is coupled to receive a control signal to limit operations around the loop to a set number of iterations for a decoding sequence. The scheduler is coupled to at least one of the first estimation unit and the second estimation unit to limit the first estimation unit and the second estimation unit responsive to the control signal to the set number of iterations around the loop for the decoding sequence. The set number of iterations is selected to be less than an optimal number of iterations for an optimal bit error rate ("BER") resulting in a BER penalty.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

FIG. 3 is a flow diagram depicting an exemplary embodiment of a decoder/data slicer flow.

FIG. 4 is a flow diagram depicting an exemplary embodiment of an iterative decoding flow.

DETAILED DESCRIPTION

Figure 1:
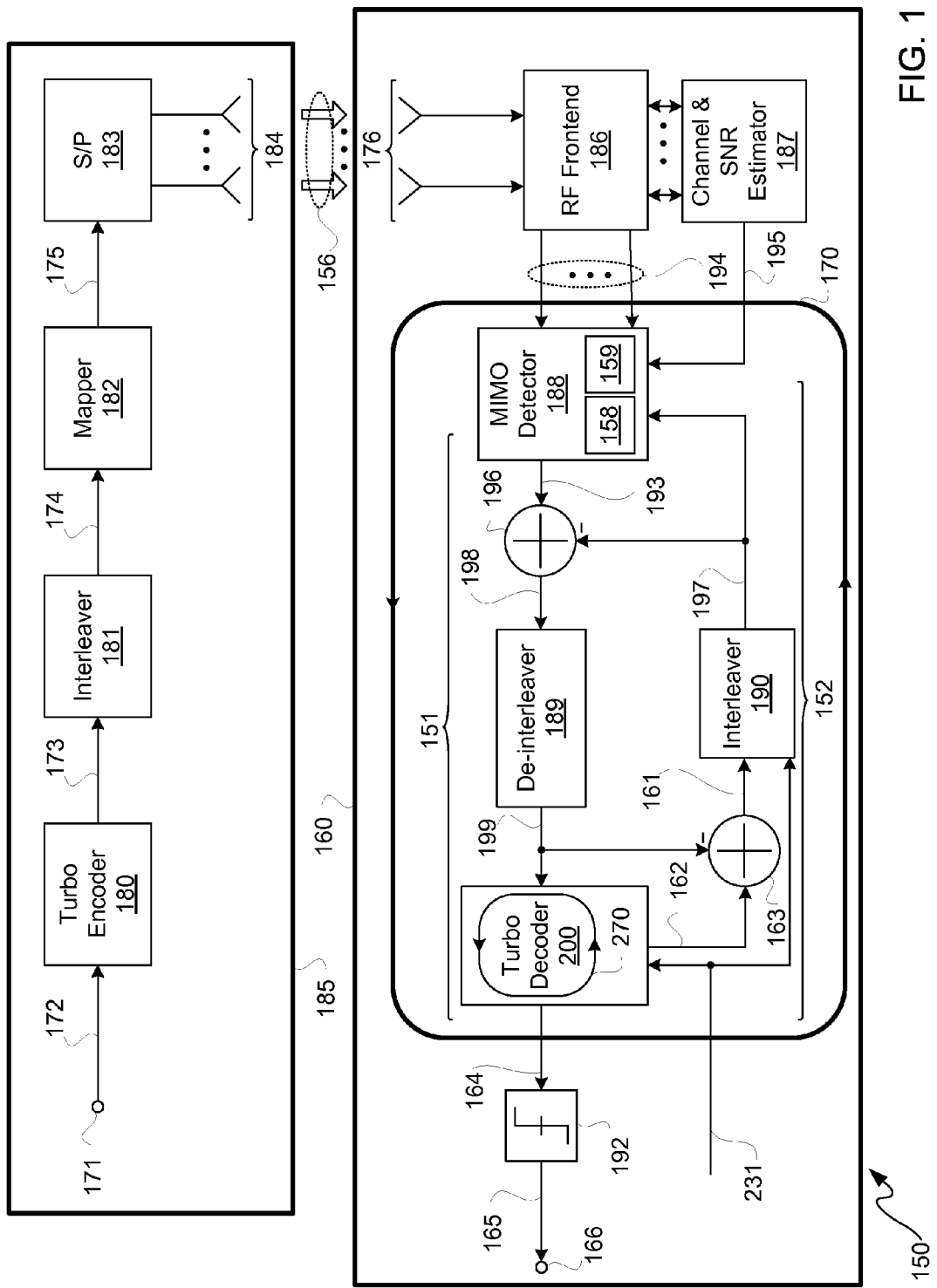
FIG. 1 is a block diagram depicting an exemplary embodiment of a communication system.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Turbo encoding generally involves providing information data bits to at least two convolutional encoders. Even though the example of a rate ⅓ encoder is used, other rates may be used. Each convolutional encoder may use a recursive systematic convolutional code. Thus, for example, two recursive systematic coders ("RSCs") may be included in a Turbo encoder. Prior to being input to one of the two convolutional encoders, one stream of information data bits undergoes a permutation, such as a pseudo-random permutation. One type of permutation may be provided by using an interleaver; however, other types of permutations that provide sufficient pseudo-randomness or randomness may be used. A Turbo encoder may provide three outputs, namely an uncoded information bitstream, a first encoded parity bitstream, and a second encoded parity bitstream. The first parity bitstream and the second parity bitstream may include a first encoded version and a second encoded version, respectively, of the unencoded information bitstream.

Bits may be mapped to symbols of a constellation, such as a type of quadrature amplitude modulation ("QAM") for example, for transmission. A transmitter with a Turbo encoder may provide three outputs that are mapped to symbols for transmission as symbol streams, namely an information data symbol stream, a first encoded parity symbol stream, and a second encoded parity symbol stream. Some noise may be introduced into these streams due to communication environment.

A maximum aposteriori probability ("MAP") process may be used for decoding by a decoder, such as a Turbo decoder. For example, in a Turbo decoder a pair of MAP estimation units may be coupled to cooperatively operate for refinement of an estimate of original information. Using MAP processing, such estimation units may output "soft decision information" obtained from parity bits, where such parity bits may be "noisy parity bits." A decoding process for each RSC may be represented using a trellis, where the number of states in such trellis at one point in time represents the number of states in an encoding state machine, and where a horizontal span of such trellis represents bits in a code block over time. For purposes of clarity by way of example not limitation, it shall be assumed that an input sequence to a decoder is obtained, where a symbol is obtained for each "clock tick." By "clock tick" it is generally meant a clock pulse or clock cycle. A number of L symbols may obtained for L ticks of a clock for forming a trellis. For a decoding process, likelihood of each state in a trellis may be determined at each defined location in time or trellis node.

As described below in additional detail, a decoder using fewer inner decoding loop iterations of a decoder is employed in a receiver having a Turbo equalizer. The reduction in the number of inner loop iterations, while costing a small bit error rate ("BER") penalty, provides a significant reduction in decoding latency. Such reduction in decoding latency means that link latency may be reduced. In other words, detecting/decoding latency of a Turbo equalizer of a receiver may be reduced. Accordingly, a wireless system may employ receivers with such Turbo equalizers having lower link latencies than in the past, provided by such reduction in inner decoding loop iterations.

FIG. 1 is a block diagram depicting an exemplary embodiment of a communication system 150. Communication system 150 includes a transmitter 185 and a receiver 160. Receiver 160 may be a Multiple-Input Multiple-Output ("MIMO") receiver for example. Transmit antennas 184 of transmitter 185 may be used to communicate transmission 156 to receive antennas 176 of receiver 160. In this exemplary embodiment, communication system 150 is a MIMO system. Thus, for purposes of clarity and not limitation it shall be assumed that input to receiver 160 is a MIMO input and that receiver 160 is a MIMO receiver. In other embodiments, a Single-Input Single-Output ("SISO") receiver may be used.

Generally, transmitter 185 includes an outer encoder, such as a Turbo encoder 180 for example, an interleaver 181, a mapper, such as a symbol mapper 182 for example, and a serial-to-parallel converter ("S/P") 183, as well as transmit antennas 184. Bit information 172 may be sourced from source 171 for input to Turbo encoder 180. Turbo encoder 180 may output multiple streams of information 173. Streams of information 173 may include an uncoded data bitstream, a first parity encoded bitstream, and a second parity encoded bitstream, as previously described herein. Again, a permutation of the uncoded data bitstream may be input to a convolutional encoder for producing the second encoded parity bitstream. Thus, for example, Turbo encoder 180 may include two convolutional encoders and a permutation block, such as an interleaver for example.

Interleaver 181 may be coupled to Turbo encoder 180 to receive streams of information 173 and may be configured to provide an interleaved version thereof, namely multiple streams of information 174. Streams of information 174 may be provided to symbol mapper 182. Symbol mapper 182 may provide multiple symbol streams 175 to S/P converter 183 for transmission 156 via transmit antennas 184.

Receiver performance, such as may be quantified in terms of BER and/or frame error rate ("FER"), may be improved by having a channel decoder, such as an iterative decoder. It may be further improved by an iterative decoder and a detector exchanging or sharing information. In this exemplary embodiment, a Turbo decoder 200 and a MIMO detector 188 are coupled for exchanging or sharing information. A configuration generally referred to as a Turbo equalizer includes a detector, such as MIMO detector 188 of receiver 160 for example, and an iterative decoder, such as Turbo decoder 200 for example, coupled for providing feedback from Turbo decoder 200 to MIMO detector 188. Feedback information, namely reliability information about each individual bit, may be used to refine information detected associated with that bit as fed forward from MIMO detector 188 to Turbo decoder 200.

In another embodiment, a Turbo decoder 200 and a SISO detector 188 may be coupled for exchanging or sharing information. Turbo decoder 200 is an example of an iterative decoder, as described below in additional detail. In another embodiment, iterative decoder 200 may be a Soft Output Viterbi Algorithm ("SOVA") decoder or other type of iterative decoder. However, for purposes of clarity and not limitation, it shall be assumed that a Turbo decoder 200 is used, even though in other embodiments another type of iterative decoder may be used.

Detector 188, whether a SISO or MIMO detector, is presented with a received waveform, whether representative of a SISO or MIMO waveform, for producing a "soft" output. Thus, for example, detector 188 may be a minimum mean squared error (MMSE) detector, a sphere detector, or other detector for generating bit-level reliability information for each bit in a received waveform.

Figure 2:
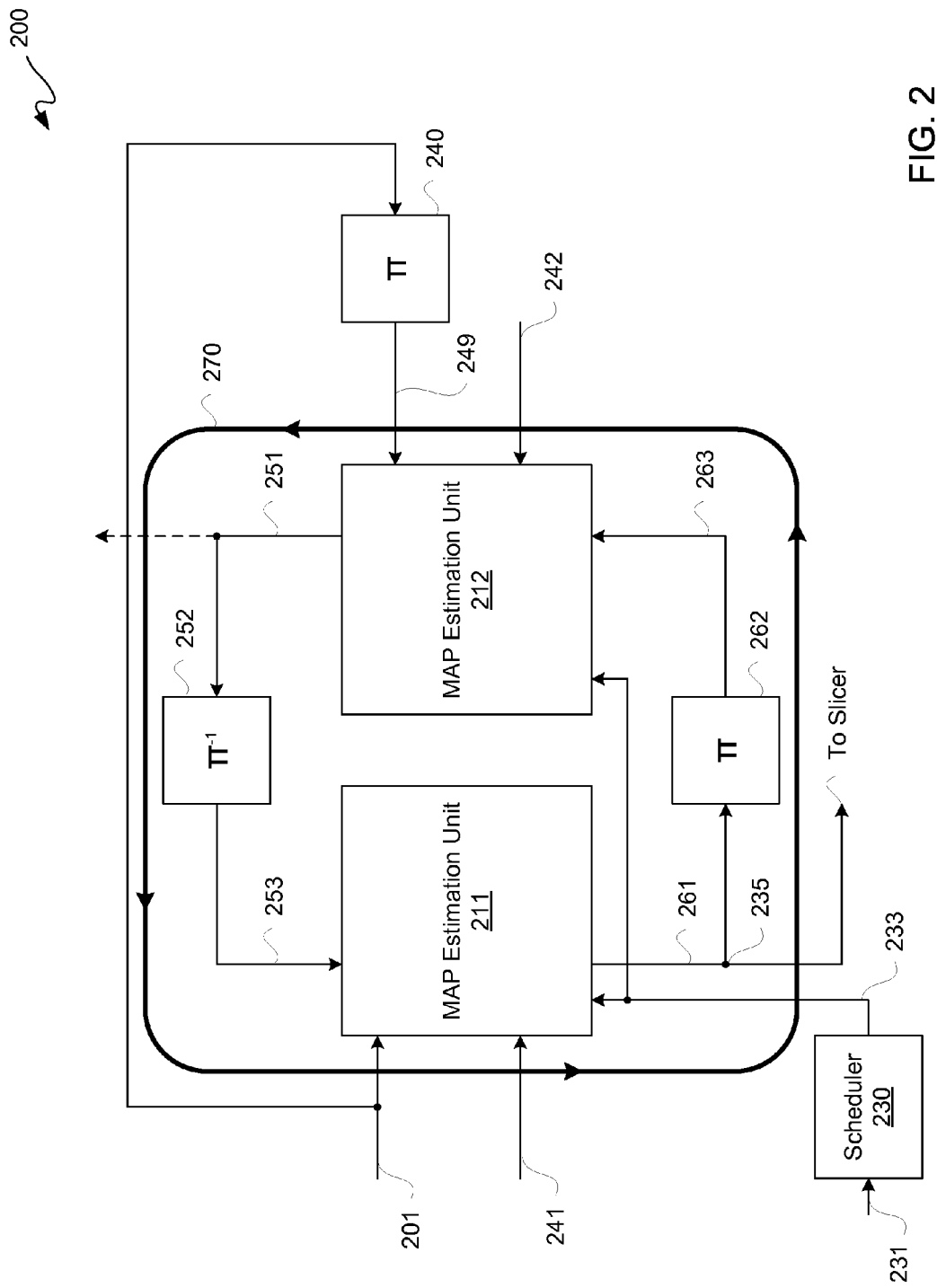
FIG. 2 is a block diagram depicting an exemplary embodiment of an iterative decoder.

Prior to further description of receiver 160, a more detailed description of an iterative decoder is provided with reference to FIG. 2. FIG. 2 is a block diagram depicting an exemplary embodiment of an iterative decoder, such as a Turbo decoder 200. Again, for purposes of clarity by way of example not limitation, a Turbo decoder 200 for a MIMO receiver 160 of FIG. 1 is described; however, in other embodiments other types of iterative decoders may be used.

A decoding process may involve computation of extrinsic information or reliability information in a first MAP decoder unit, such as MAP estimation unit 211, passing such computed reliability information to a second MAP decoder unit, such as MAP estimation unit 212, after interleaving, which second MAP decoder unit then uses this computed and interleaved information to compute its own version of reliability information or extrinsic information. This processing by a first MAP decoder unit, interleaving, and processing such processed and interleaved information by a second MAP decoder unit constitutes one iteration in an iterative decoder, such as Turbo decoder 200 for example. Generally, eight or more iterations are used in order to achieve sufficient accuracy, namely accuracy close to that obtained by using dummy recursions for initialization calculations.

With continuing reference to FIG. 2, Turbo decoder 200 is coupled to or includes a scheduler 230. Scheduler 230 receives an outer loop iteration control signal 231. Responsive to outer loop iteration control signal 231, an inner loop iteration control signal 233 is provided from scheduler 230 to MAP estimation units 211 and 212. MAP estimation units 211 and 212 may be thought of as respective decoders, but are referred to herein as estimation units so as avoid confusion.

Soft decisions or log-likelihood ratios ("LLRs") of a payload or data stream ("soft decisions") 201 are provided as an input to MAP estimation unit 211 and to interleaver 240. Such soft decisions 201 may be obtained by processing output of MIMO detector 188. A first parity stream 241, such as LLRs of first parity bits from a first constituent encoder, is obtained from output of MIMO detector 188 by demultiplexing from a data stream and is provided as an input to MAP estimation unit 211. A second parity stream 242, such as soft decisions or LLRs of second parity bits from a second constituent encoder, is obtained from output of MIMO detector 188 by demultiplexing from such a data stream and is provided as an input to MAP estimation unit 212. Demultiplexing circuitry for providing a first parity stream 241 and a second parity stream 242 is not shown for purposes of clarity.

An interleaved version of soft decisions or LLRs 201 is output from interleaver 240 as interleaved LLRs values 249, and interleaved LLR values 249 are provided as an input to MAP estimation unit 212. MAP estimation unit 212 provides reliability information output, also known as reliability information or extrinsic information output 251, as an input to de-interleaver 252. A de-interleaved version of reliability information obtained via reliability information output 251, namely reliability information output 253, is provided as an input to MAP estimation unit 211.

MAP estimation unit 211 provides reliability information output 261 as an input to interleaver 262. An interleaved version of reliability information obtained via reliability information output 261, namely reliability information output 263, is provided as an input to MAP estimation unit 212. Output of Turbo decoder 200 may be sourced from output node 235, namely may be reliability information output 261, which may be provided to a data slicer, such as data slicer 192 of FIG. 1 to generate hard decisions for bits. In another embodiment, output of Turbo decoder 200 may be sourced as reliability information output 251 for input to a data slicer.

Complete decoding of a received code block proceeds in an iterative manner around inner decoding loop 270 of Turbo decoder 200. For example, MAP estimation unit 212 produces a reliability estimate or a confidence estimate for MAP estimation unit 211 for an iteration, and on a subsequent iteration, MAP estimation unit 211 produces another reliability estimate using an immediately prior reliability estimate obtained from MAP estimation unit 212. Likewise, for example, MAP estimation unit 211 produces a reliability estimate or a confidence estimate for MAP estimation unit 212 for an iteration, and on a subsequent iteration, MAP estimation unit 212 produces another reliability estimate using an immediately prior reliability estimate obtained from MAP estimation unit 211. This process of successive refinements effectively provides decoding with improved error correcting capability.

Generally, a reliability estimate of a parity bit that has a relatively large positive number is more likely to represent a 1, and a reliability estimate of a parity bit that has a relatively large negative number is more likely to represent a −1. For a sequence of k bits for k an positive integer, a corresponding sequence of k numbers of reliability or confidence estimates respectively for each bit may be output from Turbo decoder 200, such as output 164 of Turbo decoder 200 FIG. 1.

Returning to FIG. 1, receiver 160 includes receive antennas 176, and an RF frontend 186, channel and signal-to-noise ratio ("SNR") estimator 187, MIMO detector 188, summer 196, de-interleaver 189, Turbo decoder 200, data slicer 192, summer 163, and interleaver 190. A summer with a minus port may alternatively be referred to as a "subtractor." RF frontend 186 downconverts a received signal to a baseband frequency. Within RF frontend 186, Additive White Gaussian Noise ("AWGN") may be added to a received signal as described below in additional detail.

MIMO detector 188 may include a sphere detector 159. A more detailed description of a sphere detector that may be included in MIMO detector 188, is described in additional detail in co-pending patent application entitled "Detector for a Multiple-Antenna Receiver" by Michael Wu et al., assigned application Ser. No. 13/170,004, filed Jun. 27, 2011, which is incorporated by reference herein in its entirety for all purposes. In other words, MIMO detector 188 may be this type of sphere detector. However, another type of sphere detector or another type of channel detector may be used in other embodiments.

Even though the description herein is in terms of Turbo coding, including encoding and/or decoding, other types of coding, such as low density parity check ("LDPC") coding, may be used. Turbo codes are used for channel coding in cellular wireless communication systems. Turbo codes are used in 3G WCDMA networks, Long Term Evolution ("LTE") networks, LTE-Advanced networks, military links networks, and/or WiMAX networks. However, it should be appreciated that the embodiments described herein are not limited to current data rates associated with these types of networks, but may be used in data rates from 100 megabits per second ("Mbps") to gigabit per second ("Gbps") data rates.

Receiver 160 includes a feed-forward path 151 and may include a feedback path 152. A network associated with the feed-forward path 151 may be used without a network associated with feedback path 152. As previously described, both feed-forward path 151 and feedback path 152 networks may be used in combination in what may be thought of as an iterative receiver mode, such as for example Turbo equalization.

It should be appreciated that multiple iterations with reference to decoding via loop 270, namely an "inner loop" or "inner decoding loop," and multiple iterations with reference to a loop formed of feed-forward path 151 and feedback path 152 networks, namely an "outer loop" or "outer decoding loop" 170, both introduce decoding latency. In a mode associated with feed-forward-only decoding mode ("feed-forward mode"), iterations of such an inner decoding loop 270 may be used without using feedback path 152, and generally a sufficient number of such inner decoding loop iterations may be used to achieve improved error correction.

However, in a mode associated with equalization (a "feedback mode"), iterations of an inner decoding loop 270 are used in combination with iterations of an outer decoding loop 170. For purposes of clarity and not limitation, outer decoding loop 170 may likewise be thought of as a Turbo equalizer or Turbo equalization loop 170. Because inner decoding loop iterations may be leveraged off of outer decoding loop iterations, the number of inner decoding loop iterations may be reduced.

Multiple inputs obtained from transmission 156 are received by receive antennas 176. Receive antennas 176 may be coupled to RF frontend 186. AWGN may be added to received signaling in RF frontend 186, where received signals are downconverted to a baseband frequency. After other frontend processing, such RF frontend 186 processed received signals are provided to channel and SNR estimators, such as of channel and SNR estimator 187. Single signals and/or circuit instances are illustratively depicted in some instances for purposes of clarity and not limitation to represent multiple instances thereof. These processed received signals are also provided as a symbol vector input 194 to MIMO detector 188. MIMO detector 188 may be coupled to receive channel information output 195, such as a channel matrix for example, from channel and SNR estimator 187.

Assuming for purposes of clarity by way of example and not limitation that MIMO detector 188 includes a sphere detector 159 and a parallel-to-serial converter ("P/S") 158, a list of candidate likelihood information is provided to summer 196 along feed-forward path 151. As described below in additional detail, this soft information is forwarded for a soft-input channel decoder, namely Turbo decoder 200, which refines such bit-level reliability information. Output 198 of summer 196 is provided as an input to de-interleaver 189 of feed-forward path 151. Output 199 of de-interleaver 189 is provided as an input to both Turbo decoder 200 and a minus port of summer 163. Generally, a de-interleaved version of candidate likelihood information is provided as input to Turbo decoder 200. Using such de-interleaved version of candidate likelihood information, Turbo decoder 200 decodes encoded symbol vector information to provide decoded symbol vector likelihood information output 164. As described below in additional detail, Turbo decoder 200 returns such refined bit-level reliability information to MIMO detector 188, and MIMO detector 188 may then use such refined bit-level reliability information as a priori data to improve candidate likelihood information 193 output therefrom on a subsequent iteration. Such outer decoding loop iterations may be performed multiple times as part of a decoding sequence.

Outer loop iteration control signal 231 is provided as a control signal input to both interleaver 190 and Turbo decoder 200. With respect to interleaver 190, outer loop iteration control signal 231 may be used to activate or deactivate interleaver 190, the latter of which is to disable feedback path 152. Interleaver 190 may be deactivated when receiver 160 is operated in a feed-forward mode, such that feedback path 152 is not used.

Decoded symbol vector likelihood information output 164 is provided as an input to data slicer 192. Output 165 of data slicer 192 is decoded symbol vector information, which may be provided for symbol-to-data conversion as generally indicated by sink 166.

A refined version of de-interleaved candidate likelihood information 199 is provided as output 162 from Turbo decoder 200. Output 162 is provided as input to summer 163. Output of summer 163 is a difference or refinements 161 with respect to candidate likelihood information. Such refinements 161 may be provided to interleaver 190. An interleaved version of refinements 161 is provided as output 197 from interleaver 190. Output 197 is provided as an input to a minus port of summer 196 and as an input to MIMO detector 188. Interleaved refinements output 197 may be subtracted from candidate likelihood information 193 to provide candidate likelihood information 198. Furthermore, interleaved refinements output 197 may be used by MIMO detector 188 as additional information for more accurately determining of and/or more rapidly converging to likelihood values for candidate likelihood information 193.

Scheduler 230 may limit activity of MAP estimation units 211 and 212 for a decoding sequence to a set number of iterations around inner decoding loop 270. Such set number of iterations may be selected to be less than an optimal number of iterations resulting in a BER penalty in a range of approximately 0.25 to 0.50 decibels.

FIG. 3 is a flow diagram depicting an exemplary embodiment of a decoder/data slicer flow 300. With simultaneous reference to FIGS. 1, 2, and 3, decoder/data slicer flow 300 is further described.

Decoder/data slicer flow 300 may be for a decoding process of an iterative decoder, such as Turbo decoder 200 of FIG. 2 or another type of iterative decoder. At 301, iterations of an iterative decoder are limited to a set number. For purposes of clarity by way of example and not limitation, it shall be assumed that Turbo decoder 200 is used, even though in other embodiments another type of iterative decoder may be used. Thus, for example, a number of inner decoding loop 270 iterations of Turbo decoder 200 may be set responsive to inner loop iteration control signal 233, where inner loop iteration control signal 233 has iterations scheduled responsive to outer loop iteration control signal 231 being asserted. Such set number of iterations may be selected to be less than an optimal number for a BER resulting in a BER penalty in a range of approximately 0.25 to 0.50 decibels. In other words, such BER penalty may be in a range of approximately 0.25 to 0.50 decibels greater than an optimal BER. Such BER penalty is a trade-off for less decoding latency.

For purposes of clarity by way of example and not limitation, assume a packet length of n equal to 6000, such as 6000 symbols, and a target throughput of 100 megabits per second ("Mbps"), 4.4 giga-additions or 4.4E9 additions would be used for each inner loop iteration of a Turbo decoder 200. If three inner loop Turbo decoder 200 iterations were used instead of eight, then approximately 13.2 giga-additions per second would be performed though with a BER penalty in the above-described range. However, a significant reduction in decoding latency of Turbo decoder 200 in a Turbo equalizer, such as a Turbo equalizer 170 of receiver 160, may be obtained at the cost of such BER penalty. These and/or other numerical values for packet length and throughput may be used; moreover, other applications for a Turbo equalizer other than detecting-decoding packets may be used.

At 302, inner loop decoding operations are performed within Turbo decoder 200 for such set number of iterations. FIG. 4 is a flow diagram depicting an exemplary embodiment of an iterative decoding flow 400. Iterative decoding flow 400 may be used for operations at 302. With simultaneous reference to FIGS. 1, 2, 3, and 4, decoder/data slicer flow 300 is further described.

At 401, a number of inner decoding loop 270 iterations may be set for Turbo decoder 200. At 402, an inner loop decoding iteration may be performed by Turbo decoder 200. At 403, it may be determined whether such set number of iterations has been reached. If such set number of iterations has been reached as determined at 403, then iterative decoding flow 400 in effect may return to 302 and reliability information may be output from Turbo decoder 200 at 303. If, however, it is determined at 403 that such set number of iterations has not been reached, then an iteration number may be incremented at 404 and another inner loop decoding iteration may be performed at 402. Thus for example, a counter of scheduler 230 may have its count incremented, and such incrementing may be responsive to clock signaling and/or feedback from MAP estimation units 211 and/or 212.

Reliability information output at 303 may be provided from Turbo decoder 200 to data slicer 192 to output decoded data, such as decoded symbols, as previously described. At 304, such decoded symbols may be output from data slicer 192 responsive to such reliability information output at 303.

Again, inner loop decoding operations of Turbo decoder 200 are responsive to receiving soft information (e.g., LLRs) for a data stream and parity streams, as previously described. Such streams may be from a detector or an equalizer. Moreover, reliability information output at 303 may be from MAP estimation unit 211 or 212.

By optimal number of inner loop decoding iterations it is generally meant that BER penalty is in a range of approximately 0.25 to 0.50 decibels, which generally means the number inner loop decoding iterations is 3 or 4. It should further be appreciated that in order to limit a BER penalty on the order of approximately 0.25 to 0.50 decibels for a reduction in inner loop decoding operations of Turbo decoder 200, one or more outer decoding loop 170 iterations are used in combination therewith, such as for Turbo equalization for example. Generally, this will mean 2 or 3 outer loop iterations. In other words, candidate likelihood information from a detector, such as MIMO detector 188, may be provided to a decoder, such as Turbo decoder 200, along a feed-forward path 151, and reliability information may be provided from Turbo decoder 200 to MIMO detector 188 along a feedback path 152.

It should be appreciated that Turbo equalizers may be used to improve robustness of wireless communication links, such as in next-generation commercial cellular and/or military-style wireless systems. Receivers, such as receiver 160, may employ inner and outer decoding loops; the latter of which more particularly is a detecting-decoding loop. As described herein, the number of iterations of an inner decoding loop may be significantly reduced with only minimal impact to BER performance resulting in substantial savings in decoding latency. Overall, this means link latency may be reduced in such systems. In other words, reducing the number of inner decoding loop iterations effectively reduces detecting/decoding latency. A reduction in link latency may increase throughput in such systems. A reduction in Turbo equalizer latency, may make Turbo equalizers a more desirable choice in wireless networks to improve quality of service ("QoS"), and may reduce power consumption due to receivers having to perform fewer iterations.

An iterative decoder, such as Turbo decoder 200 for example, may be implemented in an ASIC, an ASSP, or as an accelerator in a multicore system-on-chip ("SoC") or multi-chip module ("MCM"). A multicore may include an array of general-purpose processors or special-purpose processors, where digital signal processors ("DSPs") may be included. Optionally, an iterative decoder, such as Turbo decoder 200 for example, may be implemented in a programmable logic device ("PLD"), as a hard macro block or as a soft core instantiated in programmable resources.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 5:
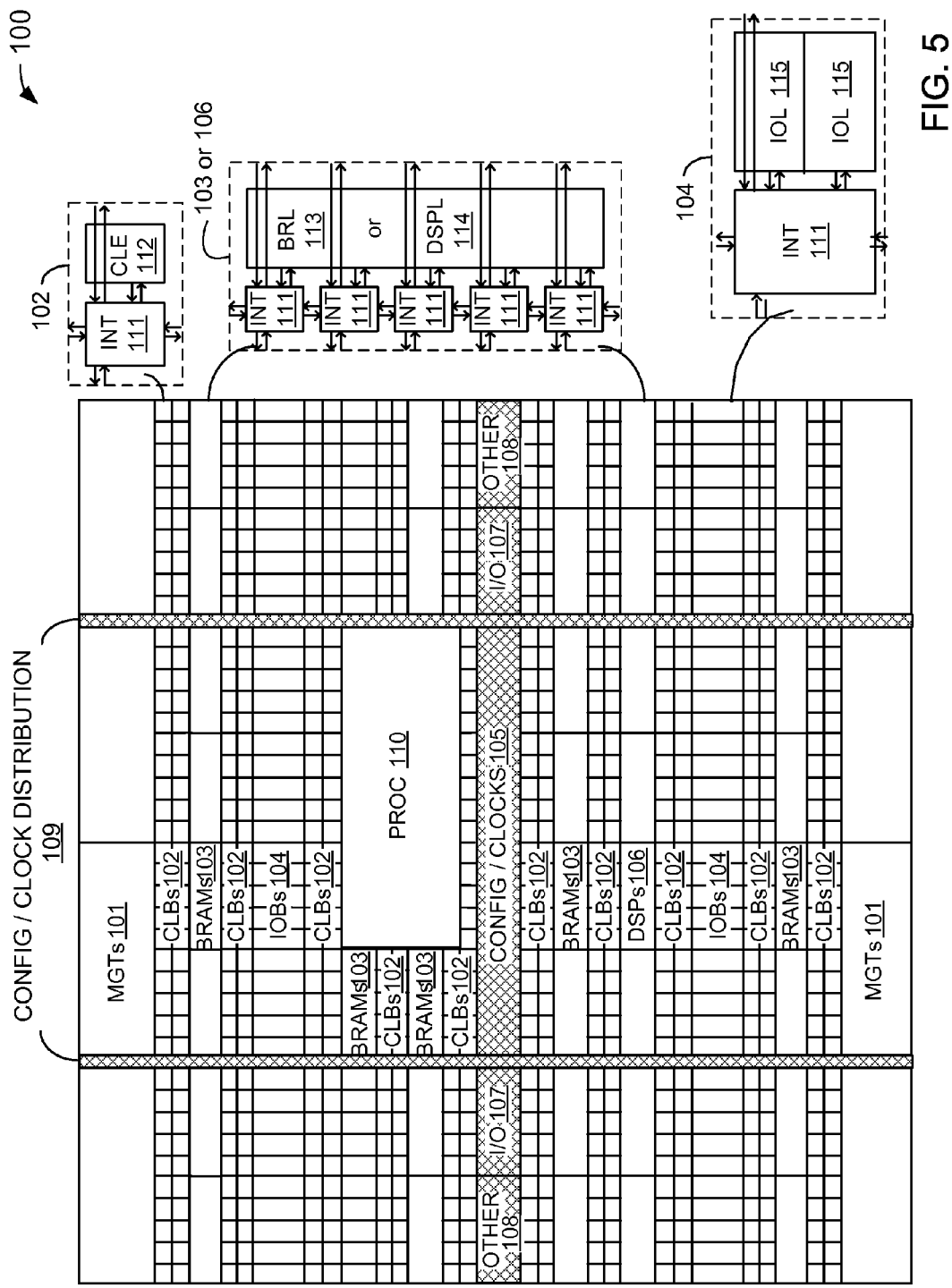
FIG. 5 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 5 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 5.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 5) is used for configuration, clock, and other control logic. Vertical columns 109 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. A method for decoding, comprising:
providing candidate likelihood information from a detector to a decoder along a feed-forward path;
limiting the decoder to a set number of iterations for a decoding sequence;
wherein the set number of iterations is selected to be less than an optimal number of iterations for an optimal bit error rate ("BER") resulting in a BER penalty;
performing inner loop decoding operations within the decoder for the set number of iterations;
providing first reliability information from the decoder to the detector along a feedback path;
activating or deactivating the feedback path in response to an iteration control signal;
outputting the first reliability information from the decoder to a data slicer; and
outputting a symbol stream from the data slicer responsive to the first reliability information.

2. The method according to claim 1, wherein the inner loop decoding operations are performed on:
a data stream provided to a first estimation unit and a first interleaver;
a first parity stream provided to the first estimation unit; and
a second parity stream provided to a second estimation unit.

3. The method according to claim 2, wherein the inner loop decoding operations are responsive to outputting from the first interleaver a first interleaved version of the data stream for input to the second estimation unit.

4. The method according to claim 3, wherein the inner loop decoding operations for an iteration of the set number of iterations include:
outputting from the second estimation unit the first reliability information;
inputting the first reliability information to a de-interleaver to provide a de-interleaved version thereof as second reliability information;
inputting the second reliability information to the first estimation unit;
outputting third reliability information from the first estimation unit;
inputting the third reliability information to a second interleaver to provide an interleaved version thereof as fourth reliability information; and
inputting the fourth reliability information to the second estimation unit.

5. The method according to claim 4, wherein:
log-likelihood ratios ("LLRs") of the data stream are obtained in association with a Multiple-Input Multiple-Output ("MIMO") or a Single-Input Single-Output ("SISO") channel;
the LLRs of the data stream are LLRs of the symbol stream;
the first parity stream is a first symbol parity stream; and
the second parity stream is a second symbol parity stream.

6. The method according to claim 4, wherein:
the first estimation unit is a first maximum aposteriori probability ("MAP") unit; and
the second estimation unit is a second MAP unit.

7. The method according to claim 4, wherein the set number of iterations is in a range of 3 to 4.

8. The method according to claim 4, wherein the BER penalty is in a range of 0.25 to 0.50 decibels from the optimal BER.

9. The method according to claim 3, wherein the inner loop decoding operations for an iteration of the set number of iterations include:
outputting from the first estimation unit the first reliability information;
inputting the first reliability information to a second interleaver to provide an interleaved version thereof as second reliability information;
inputting the second reliability information to the second estimation unit;
outputting third reliability information from the second estimation unit;
inputting the third reliability information to a de-interleaver to provide a de-interleaved version thereof as fourth reliability information; and
inputting the fourth reliability information to the first estimation unit.

10. The method according to claim 9, wherein:
log-likelihood ratios ("LLRs") of the data stream are obtained in association with a Multiple-Input Multiple-Output ("MIMO") or a Single-Input Single-Output ("SISO") channel;
the LLRs of the data stream are LLRs of the symbol stream;
the first parity stream is a first symbol parity stream; and
the second parity stream is a second symbol parity stream.

11. The method according to claim 9, wherein:
the first estimation unit is a first maximum aposteriori probability ("MAP") unit; and
the second estimation unit is a second MAP unit.

12. The method according to claim 9, wherein the set number of iterations is in a range of 3 to 4.

13. The method according to claim 9, wherein the BER penalty is in a range of 0.25 to 0.50 decibels from the optimal BER.

14. A circuit, comprising:
a decoder, including:
a first estimation unit and a second estimation unit coupled in a loop for iterative decoding;
a scheduler coupled to receive a first control signal to limit operations around the loop to a set number of iterations for a decoding sequence;
wherein the scheduler is coupled to at least one of the first estimation unit and the second estimation unit to limit the first estimation unit and the second estimation unit responsive to the control signal to the set number of iterations around the loop for the decoding sequence; and
wherein the set number of iterations is selected to be less than an optimal number of iterations for an optimal bit error rate ("BER") resulting in a BER penalty; and
a detector coupled via a feed-forward path to the decoder to provide candidate likelihood information to the decoder;
wherein the detector is further coupled to the decoder via a feedback path to receive either first reliability information or second reliability information from the decoder; and
wherein the feedback path is activated or deactivated in response to an iteration control signal.

15. The decoder according to claim 14, further comprising:
a first interleaver coupled to receive first reliability information from the first estimation unit;
the second estimation unit coupled to receive output from the first interleaver;
a second interleaver and the first estimation unit coupled to receive a data stream;
the second estimation unit coupled to receive output from the second interleaver;
a first de-interleaver coupled to receive second reliability information from the second estimation unit;
the first estimation unit coupled to receive output from the first de-interleaver;
the first estimation unit coupled to receive a first parity stream; and
the second estimation unit coupled to receive a second parity stream.

16. The decoder according to claim 15, wherein:
the first parity stream is a first symbol parity stream;
the second parity stream is a second symbol parity stream; and
either the first parity stream or the second parity stream has been permutated.

17. The decoder according to claim 15, wherein the BER penalty is in a range of 0.25 to 0.50 decibels from the optimal BER.

* * * * *